(12) United States Patent
Kim et al.

(10) Patent No.: US 12,185,618 B2
(45) Date of Patent: Dec. 31, 2024

(54) DISPLAY DEVICE AND METHOD FOR REPAIRING DISPLAY DEVICE

(71) Applicant: Samsung Display Co., Ltd., Yongin-Si (KR)

(72) Inventors: Kyumin Kim, Suwon-si (KR); Jeehoon Kim, Cheonan-si (KR); Hui-Won Yang, Seoul (KR); Yu-Jin Kim, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 651 days.

(21) Appl. No.: 17/485,729

(22) Filed: Sep. 27, 2021

(65) Prior Publication Data

US 2022/0209207 A1 Jun. 30, 2022

(30) Foreign Application Priority Data

Dec. 24, 2020 (KR) .......................... 10-2020-0182998

(51) Int. Cl.
| | |
|---|---|
| *H01L 51/56* | (2006.01) |
| *H10K 59/131* | (2023.01) |
| *H10K 59/88* | (2023.01) |
| *H10K 71/00* | (2023.01) |
| *H10K 71/70* | (2023.01) |

(52) U.S. Cl.
CPC ........... *H10K 71/00* (2023.02); *H10K 59/131* (2023.02); *H10K 59/88* (2023.02); *H10K 71/70* (2023.02); *H10K 71/861* (2023.02)

(58) Field of Classification Search
CPC ...... H10K 71/00; H10K 59/131; H10K 71/70; H10K 59/88
See application file for complete search history.

(56) References Cited

U.S. PATENT DOCUMENTS

2012/0105758 A1   5/2012  Qin et al.
2019/0305234 A1*  10/2019 Jung .................. H10K 71/00

FOREIGN PATENT DOCUMENTS

| KR | 1019990081248 A | 11/1999 |
|---|---|---|
| KR | 100474002 B1 | 7/2005 |
| KR | 100577301 B1 | 5/2006 |

* cited by examiner

*Primary Examiner* — Walter H Swanson
(74) *Attorney, Agent, or Firm* — CANTOR COLBURN LLP

(57) ABSTRACT

A display device includes: an array of pixels disposed on a display area; a connection pad disposed on a pad area; a transmission line electrically coupled with the connection pad; and a conductive dummy pattern disposed under the transmission line. A part of the conductive dummy pattern overlaps the transmission line in a plan view. The transmission line transmits a driving signal or a power signal to the array of pixels. The connection pad includes a pad conductive layer electrically coupled with the transmission line, and a passivation layer disposed on the pad conductive layer. The passivation layer covers at least a side surface of the pad conductive layer and defines an opening overlapping the conductive dummy pattern and the transmission line in the plan view.

15 Claims, 9 Drawing Sheets

DISPLAY DEVICE AND METHOD FOR REPAIRING DISPLAY DEVICE

This application claims priority to Korean Patent Application No. 10-2020-0182998, filed on Dec. 24, 2020, and all the benefits accruing therefrom under 35 U.S.C. § 119, the content of which in its entirety is herein incorporated by reference.

BACKGROUND

Field

Embodiments described herein relate to a display device. Specifically, embodiments described herein relate to a display device and method for repairing the display device.

Discussion of the Background

Generally, a display device may include a display panel and a driving element providing a driving signal to the display panel. A driving chip may include the driving element. The driving chip may be directly combined with a connection pad of the display panel or may be connected to the connection pad through a flexible circuit film.

The connection pad may include one or more conductive layers. When the conductive layer is corroded or damaged, a reliability of the display device may be deteriorated.

SUMMARY

Embodiments provide a display device with improved reliability.

Embodiments provide a display device repair method for improving the reliability of the display device.

A display device according to an embodiment may include: an array of pixels disposed on a display area; a connection pad disposed on a pad area; a transmission line electrically coupled with the connection pad; and a conductive dummy pattern disposed under the transmission line. The transmission line transmits a driving signal or a power signal to the array of pixels. A part of the conductive dummy pattern overlaps the transmission line in a plan view. The connection pad includes: a pad conductive layer electrically coupled with the transmission line, and a passivation layer disposed on the pad conductive layer. The passivation layer covers at least a side surface of the pad conductive layer and defines an opening overlapping the conductive dummy pattern and the transmission line in the plan view.

In one embodiment, the transmission line may include a first transmission line, and a second transmission line spaced apart from the first transmission line.

In one embodiment, the conductive dummy pattern may overlap the first transmission line in a first area, and overlap the second transmission line in a second area in the plan view.

In one embodiment, the passivation layer may define a first opening spaced apart from the pad conductive layer and a second opening spaced apart from the pad conductive layer. The first opening may overlap the conductive dummy pattern and the first transmission line in the plan view. The second opening may overlap the conductive dummy pattern and the second transmission line in the plan view.

In one embodiment, the first transmission line may be electrically coupled with the conductive dummy pattern in an area overlapping the first opening in the plan view. And the second transmission line may be electrically coupled with the conductive dummy pattern in an area overlapping the second opening in the plan view.

In one embodiment, the display device may further include a buffer layer disposed between the conductive dummy pattern and the transmission line. The buffer layer may cover the conductive dummy pattern.

In one embodiment, the pad conductive layer may include a lower pad conductive layer electrically coupled with the transmission line, and an upper pad conductive layer disposed on the lower pad conductive layer. The upper pad conductive layer may cover an upper surface of the lower pad conductive layer.

In one embodiment, the lower pad conductive layer may include copper.

In one embodiment, the upper pad conductive layer may include indium zinc oxide, zinc tin oxide, indium oxide, zinc oxide, or tin oxide.

In one embodiment, the display device may further include a first insulation layer disposed under the transmission line.

In one embodiment, the display device may further include a second insulation layer disposed on the transmission line.

In one embodiment, the transmission line may be provided in plural, and the conductive dummy pattern may overlap the plurality of transmission lines.

In one embodiment, the conductive dummy pattern may have a 'U' shape.

In one embodiment, the conductive dummy pattern may have an 'H' shape.

In one embodiment, the conductive dummy pattern may overlap one transmission line.

A repairing method of a display device including an array of pixels disposed on a display area, a connection pad disposed on a pad area, a transmission line electrically coupled with the connection pad and which transmits a driving signal or a power signal to the array of pixels, and a conductive dummy pattern disposed under the transmission line, a part of which overlapping the transmission line, where the connection pad including a pad conductive layer electrically coupled with the transmission line, and a passivation layer disposed on the pad conductive layer and which covers at least a side surface of the pad conductive layer and defines an opening overlapping the conductive dummy pattern and the transmission line, is provided. The repairing method includes electrically coupling the conductive dummy pattern and the transmission line by irradiating the opening with a laser.

In one embodiment, the method may further include inputting a test signal to the transmission line; and checking an output of the test signal.

In one embodiment, the checking of the output may include checking an emission of light from the array of pixels.

In one embodiment, the irradiating of the opening with the laser may be performed based on determining that the output is not identified.

In the present invention according to the embodiments, by irradiating the opening formed in the passivation layer with the laser, the conductive dummy pattern may be electrically coupled with the transmission line. Accordingly, even if a defect occurs in the pad conductive layer, the driving signal may be transmitted to the array of pixels through a transmission line and a conductive dummy pattern. So, even if the defect occurs in the pad conductive layer, a reliability of the display device may not deteriorate.

BRIEF DESCRIPTION OF THE DRAWINGS

The accompanying drawings, which are included to provide a further understanding of the invention and are incorporated in and constitute a part of this specification, illustrate exemplary illustrative embodiments of the invention, and together with the description serve to explain the inventive concepts.

DETAILED DESCRIPTION

Hereinafter, embodiments of the present inventive concept will be explained in detail with reference to the accompanying drawings.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 1:
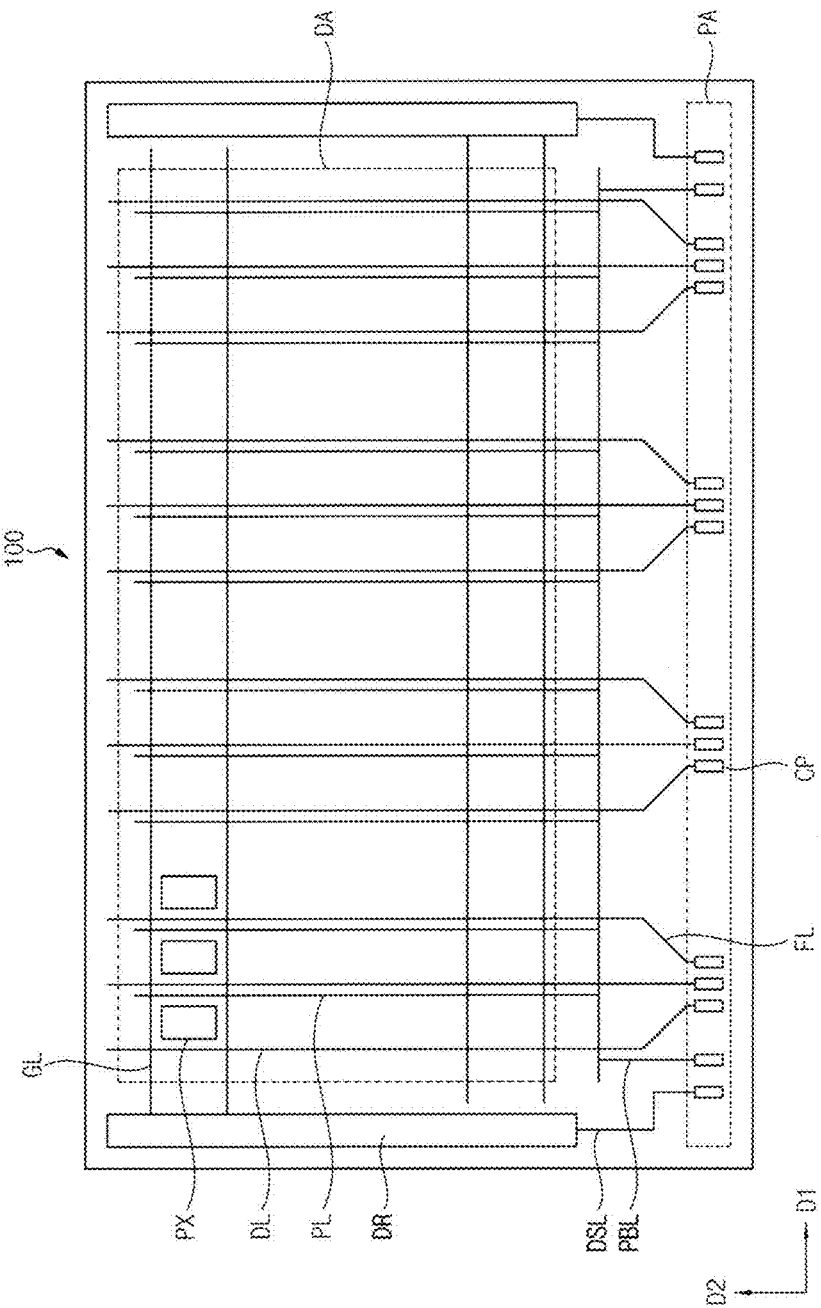
FIG. 1 is a plan view illustrating a display device according to an embodiment of the present invention.

FIG. 1 is a plan view illustrating a display device according to an embodiment of the present invention.

Referring to FIG. 1, a display device 100 may include a display area DA and a peripheral area surrounding the display area DA. The display area DA may emit light to display an image. The peripheral area may not display the image.

In one embodiment, the display device 100 may include an organic light emitting display device. For example, an array of pixels PX including a light emitting element may be disposed in the display area DA to generate light controlled by a driving signal. A signal line and a power line providing the driving signal and a power signal to the pixel PX may be disposed in the display area DA. For example, a gate line GL extending in a first direction D1 and providing a gate signal to the pixel PX, a data line DL extending in a second direction D2 crossing the first direction D1 and providing a data signal to the pixel PX, and a power line PL extending in the second direction D2 and providing the power signal to the pixel PX may be disposed in the display area DA.

A circuit part for generating the driving signal and a transmission line for transmitting the driving signal or the power signal to the display area DA or transmitting a control signal to the circuit part may be disposed in the peripheral area. For example, a driving part DR generating the gate signal, a control signal line DSL transmitting the control signal to the driving part DR, a fan-out line FL transmitting the data signal to the data line DL, and a power signal transmission line PBL transmitting the power signal to the power line PL may be disposed in the peripheral area.

In one embodiment, the peripheral area may include a pad area PA in which the connection pad CP is disposed. For example, the pad area PA may have a shape extending along one side of the display device 100. A plurality of the connection pad CP may be disposed in the pad area PA.

The transmission line TL (See FIG. 3) may extend to the pad area PA, and the connection pad CP may be electrically coupled with the transmission line. For example, the connection pad CP may be electrically coupled with at least one of the control signal line DSL, the fan-out line FL, and the power signal transmission line PBL.

A driving element may be bonded to the connection pad CP. Accordingly, the transmission line may be electrically coupled with the driving element, and may receive the driving signal, the control signal, and the power signal from the driving element.

In an embodiment, for example, the driving element may be a flexible circuit film on which a driving chip is mounted or be a printed circuit board. The driving element may be directly bonded to the pad area PA, or may be electrically coupled with the connection pad CP of the pad area PA through a connection part such as the flexible circuit film.

Figure 2:
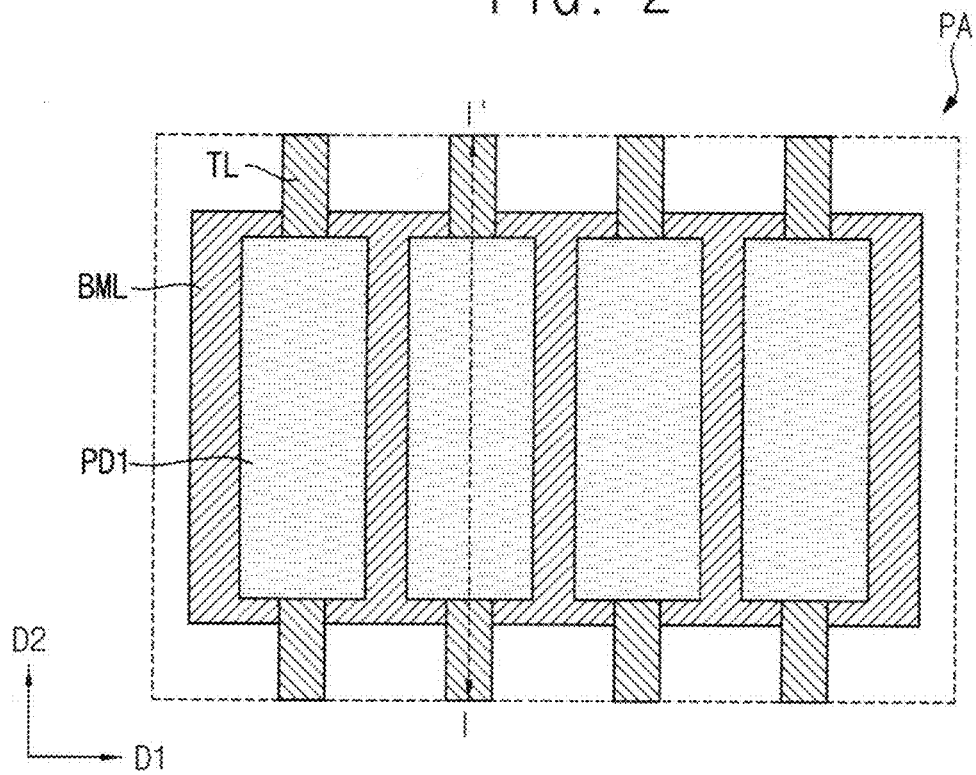
FIG. 2 is a plan view enlarging a pad area of FIG. 1.
Figure 3:
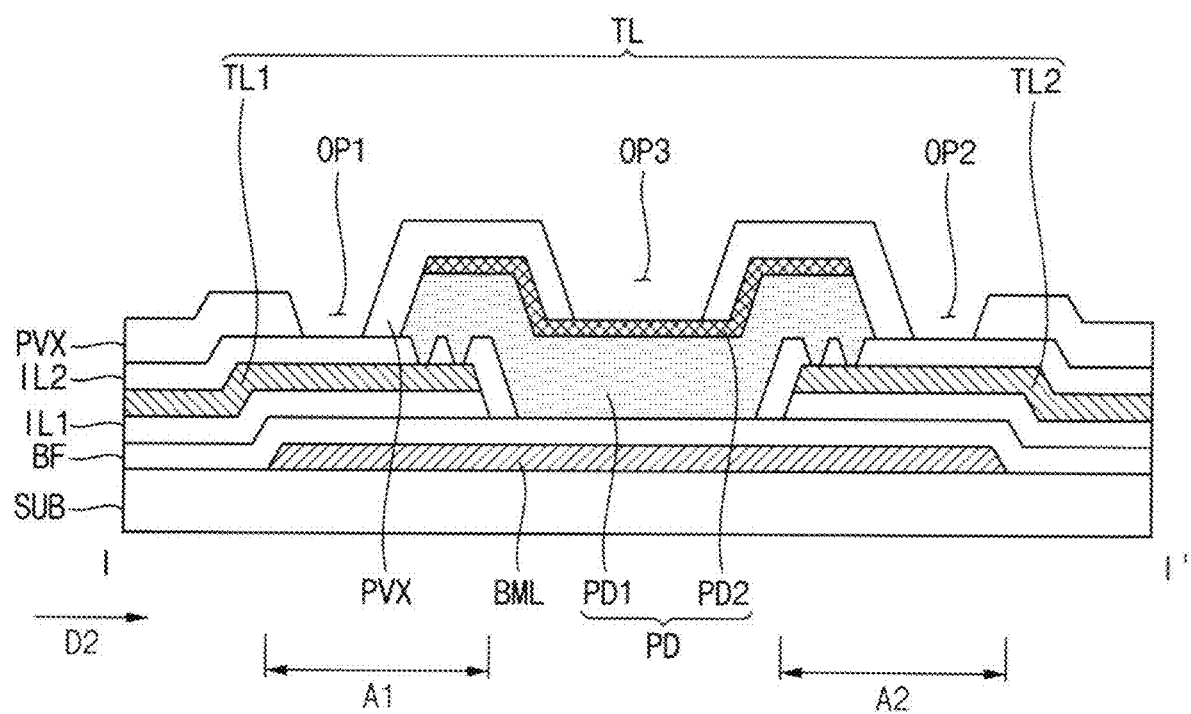
FIG. 3 is a cross-sectional view taken along I-I' of FIG. 2.
Figure 4:
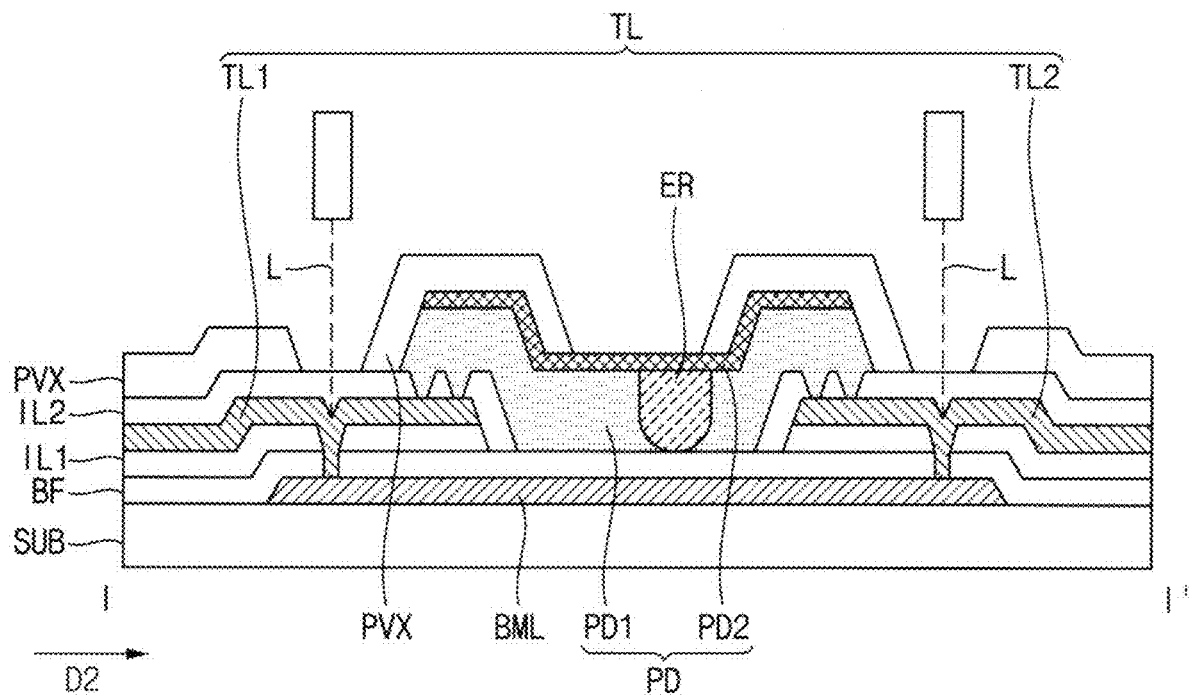
FIG. 4 is a cross-sectional view taken along I-I' of FIG. 2.

FIG. 2 is a plan view enlarging a pad area of FIG. 1. FIG. 3 is a cross-sectional view taken along I-I' of FIG. 2. FIG. 4 is a cross-sectional view taken along I-I' of FIG. 2.

Referring to FIG. 2 and FIG. 3, the display device 100 may include a substrate SUB, a conductive dummy pattern BML, a buffer layer BF, a first insulation layer IL1, a transmission line TL, a second insulation layer IL2, and a connection pad. The connection pad may include a pad conductive layer PD and a passivation layer PVX.

The substrate SUB may include glass, quartz, silicon, or a polymer material.

The conductive dummy pattern BML may be disposed on the substrate SUB. The conductive dummy pattern BML may include a conductive material. For example, the conductive dummy pattern BML may include metal, conductive polymer, or the like. The conductive dummy pattern BML may not be electrically coupled with the transmission line TL and the pad conductive layer PD. But, when a defect occurs in the pad conductive layer PD, the conductive dummy pattern BML may be electrically coupled with the transmission line TL. A part of the conductive dummy pattern BML may overlap the transmission line TL on a plan view.

The buffer layer BF covering the conductive dummy pattern BML may be disposed on the conductive dummy pattern BML. The buffer layer BF may be disposed under the transmission line TL. The buffer layer BF may reduce or block penetration of moisture or outside air form the substrate SUB and the conductive dummy pattern BML. The buffer layer BF may include silicon oxide, silicon nitride, silicon oxynitride, or the like.

The first insulation layer IL1 may be disposed on the buffer layer BF. The first insulation layer IL1 may be disposed under the transmission line TL. For example, an upper surface of the first insulation layer IL1 may be directly contact with a lower surface of the transmission line TL, and a shape in a plan view of the first insulation layer IL1 may be substantially the same as a shape in a plan view of the transmission line TL. The first insulation layer IL1 may insulate the transmission line TL from the conductive dummy pattern BML. The first insulation layer IL1 may include silicon oxide, silicon nitride, silicon oxynitride, insulating metal oxide, or a combination thereof, and may have a single layer structure or a multilayer structure. The insulating metal oxide may include aluminum oxide, tantalum oxide, hafnium oxide, zirconium oxide, titanium oxide, or the like.

The transmission line TL may be disposed on the first insulation layer IL1. The transmission line TL may be one of the control signal line DSL, the fan-out line FL, and the power signal transmission line PBL. Or, the transmission line TL may be a line connected to the control signal line DSL, the fan-out line FL, and the power signal transmission line PBL. The transmission line TL may include gold, silver, aluminum, copper, nickel, platinum, magnesium, chromium, tungsten, molybdenum, titanium, tantalum, or an alloy thereof, and may have a single layer or a multilayer structure including different metal layers.

In one embodiment, the transmission line TL may include a first transmission line TL1 and a second transmission line TL2. The second transmission lien TL2 may be spaced apart from the first transmission line TL1. The second transmission line TL2 may be electrically coupled with the array of the pixels PX. The first transmission line TL1 may be electrically coupled with the array of the pixels PX through the pad conductive layer PD and the second transmission line TL2.

The second insulation layer IL2 may be disposed on the transmission line TL. The second insulation layer IL2 may cover the transmission line TL. The second insulation layer IL2 may define a contact hole therein, and the transmission line TL may be electrically coupled with the pad conductive layer PD through the contact hole. The second insulation layer IL2 may include silicon oxide, silicon nitride, silicon oxynitride, insulating metal oxide, or a combination thereof, and may have a single layer structure or a multilayer structure. The insulating metal oxide may include aluminum oxide, tantalum oxide, hafnium oxide, zirconium oxide, titanium oxide, or the like.

The pad conductive layer PD may include conductive material. For example, the pad conductive layer PD may include a copper (CU). The pad conductive layer PD may be electrically coupled with the transmission line TL. For example, the pad conductive layer PD may be electrically coupled with the transmission line TL through the contact hole of the second insulation layer IL2.

In one embodiment, the pad conductive layer PD may include a lower pad conductive layer PD1 and an upper pad conductive layer PD2. The lower pad conductive layer PD1 may be electrically coupled and directly contact with the transmission line TL. The upper pad conductive layer PD2 may be disposed on the lower pad conductive layer PD1, and may cover an upper surface of the lower pad conductive layer PD2. Accordingly, the upper pad conductive layer PD2 may prevent the lower pad conductive layer PD1 from corrosion. For example, the lower pad conductive layer PD1 may include copper (CU). For example, the upper pad conductive layer PD2 may include indium zinc oxide, zinc tin oxide, indium oxide, zinc oxide, or tin oxide.

The passivation layer PVX may be disposed on the pad conductive layer PD. The passivation layer PVX may prevent the pad conductive layer PD from corrosion. The passivation layer PVX may cover at least a side surface of the pad conductive layer PD.

The passivation layer PVX may define a first opening OP1 and a second opening OP2 overlapping the conductive dummy pattern BMN and the transmission line TL in a plan view.

In an embodiment, for example, when the transmission line TL includes the first transmission line TL1 and the second transmission line TL2, the conductive dummy pattern BML may overlap the first transmission line TL1 in a first area A1, and overlap the second transmission line TL2 in a second area A2 in a plan view. In this case, the passivation layer PVX may define the first opening OP1 spaced apart from the pad conductive layer PD and overlapping the conductive dummy pattern BML and the first transmission line TL1, and the second opening OP2 spaced apart from the pad conductive layer PD and overlapping the conductive dummy pattern BML and the second transmission line TL2.

The passivation layer PVX may further define a third opening OP3 exposing a part of an upper surface of the pad conductive layer PD.

A conductive bonding element may be disposed on the upper pad conductive layer PD2, and the driving element may be disposed on the conductive bonding element. The driving element may supply the driving signal and the power signal. The driving element may be electrically coupled with the conductive bonding element, and the conductive bonding element may be electrically coupled with the upper pad conductive layer PD2 through the third opening OP3. Accordingly, the driving signal or the power signal supplied from the driving element may be transmitted to the second transmission line TL2 through the pad conductive layer PD.

FIG. 4 illustrates a case that a defect ER may occur in the pad conductive layer PD. A conductivity of the pad conductive layer PD may be relatively reduced due to the defect ER. Accordingly, the driving signal or the power signal supplied from the driving element may be not transmitted to the second transmission line TL2 through the pad conductive layer PD.

To solve this problem, the transmission line TL may be electrically coupled with the conductive dummy pattern BML. Specifically, the transmission line TL may be extended in a direction of the conductive dummy pattern BML by irradiating the transmission line TL with a laser L. Accordingly, the driving signal or the power signal supplied from the driving element may be transferred to the second transmission line TL2 through the pad conductive layer PD, the first transmission line TL1, and the conductive dummy pattern BML. The driving signal or the power signal transmitted to the second transmission line TL2 may be transmitted to the array of pixels PX.

The laser L may pass through the first opening OP1 and the second opening OP2. Accordingly, in an area overlapping the first opening OP1, the first transmission line TL1 may be electrically coupled with the conductive dummy pattern BML, and in an area overlapping the second opening OP2, the second transmission line TL2 may be electrically coupled with the conductive dummy pattern BML.

Figure 5:
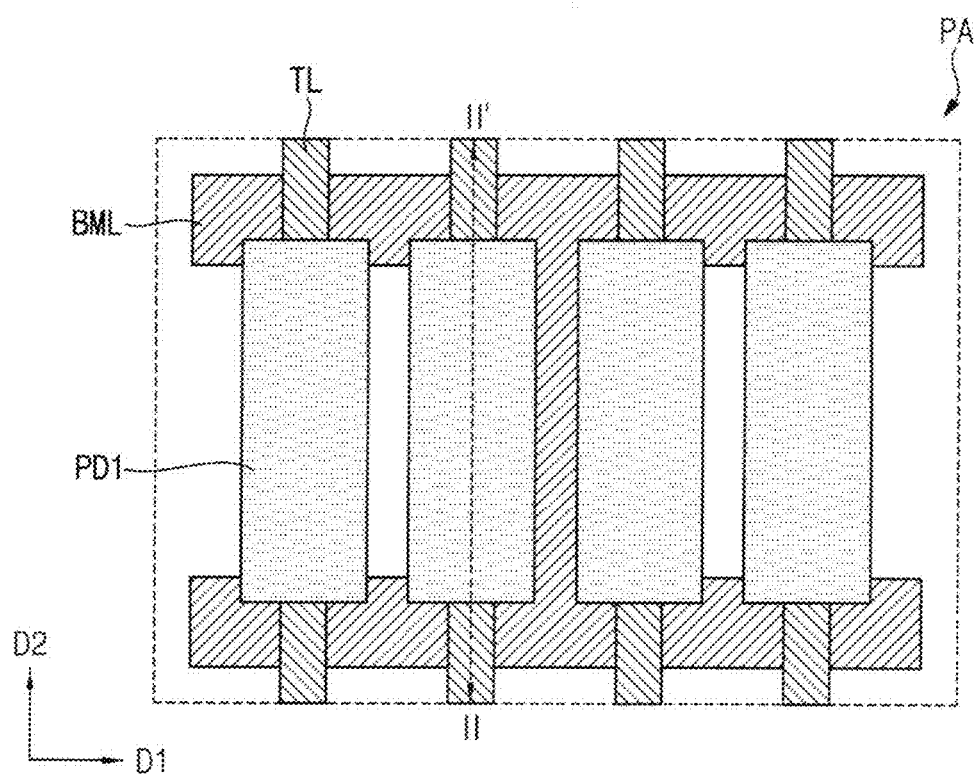
FIG. 5, FIG. 6, FIG. 7, and FIG. 8 are diagrams illustrating a conductive dummy pattern according to embodiments of the present invention.
Figure 6:
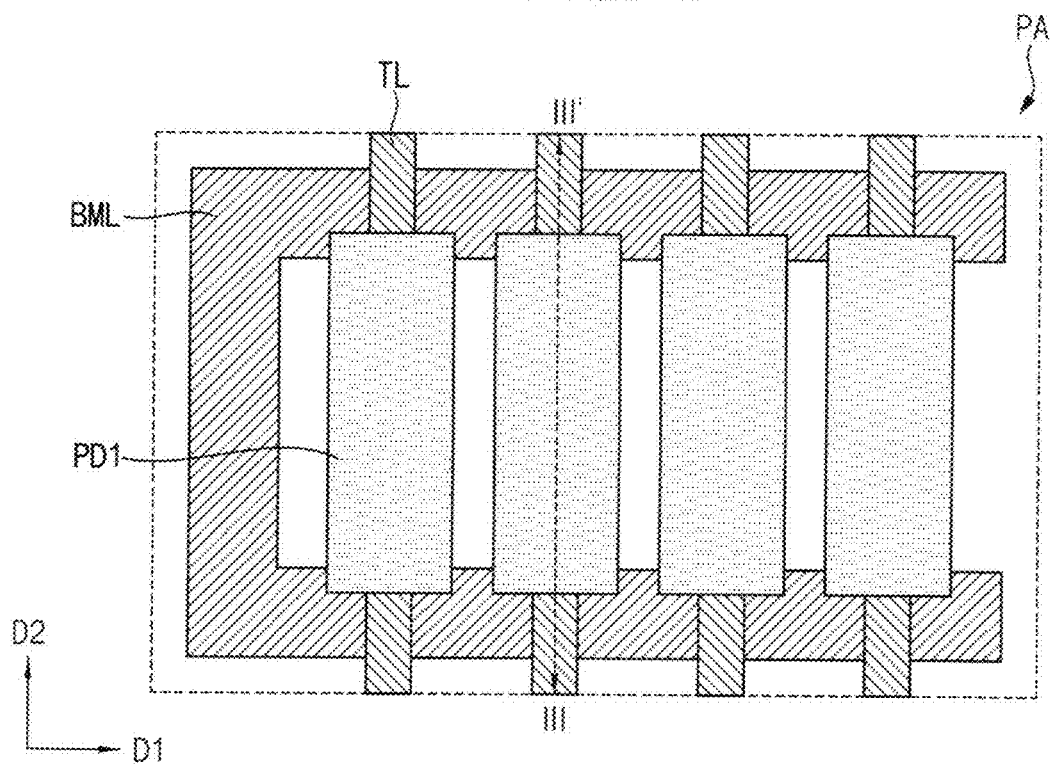
Figure 7:
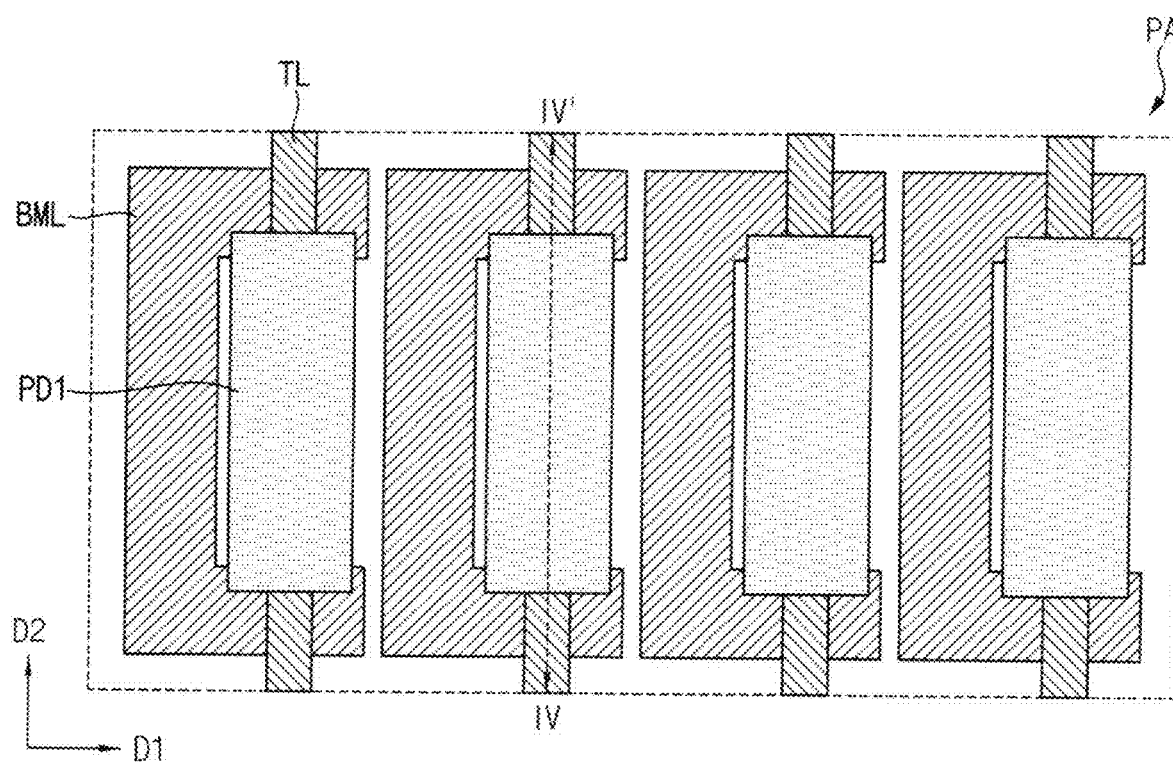

FIG. 5, FIG. 6, FIG. 7, and FIG. 8 are diagrams illustrating a conductive dummy pattern according to embodiments of the present invention. Each of FIG. 5, FIG. 6, and FIG. 7 is a plan view enlarging the pad area of FIG. 1.

Referring to FIG. 5, the conductive dummy pattern BML may overlap a plurality of the transmission lines TL in a plan view. In this case, the conductive dummy pattern BML may have an 'H' shape. In FIG. 5, an embodiment in which one conductive dummy pattern BML overlaps four transmission lines TL is illustrated, but the number of the transmission lines TL to which one conductive dummy pattern BML overlaps according to the invention is not limited thereto. For example, one conductive dummy pattern BML may overlap five or more transmission lines TL in another embodiment.

Referring to FIG. 6, the conductive dummy pattern BML may overlap a plurality of the transmission lines TL in a plan view. In this case, the conductive dummy pattern BML may have a 'U' shape. In FIG. 6, an embodiment in which one conductive dummy pattern BML overlaps four transmission lines TL is illustrated, but the number of the transmission lines TL to which one conductive dummy pattern BML overlaps according to the invention is not limited thereto. For example, one conductive dummy pattern BML may overlap five or more transmission lines TL in another embodiment.

Referring to FIG. 7, one conductive dummy pattern BML may overlap one transmission line TL in a plan view. In this case, the conductive dummy pattern BML may have a 'U' shape. But, a shape of the conductive dummy pattern BML according to the invention is not limited thereto. For example, the shape of the conductive dummy pattern BML may be an 'H' shape or a rectangle shape in another embodiment.

Figure 8:
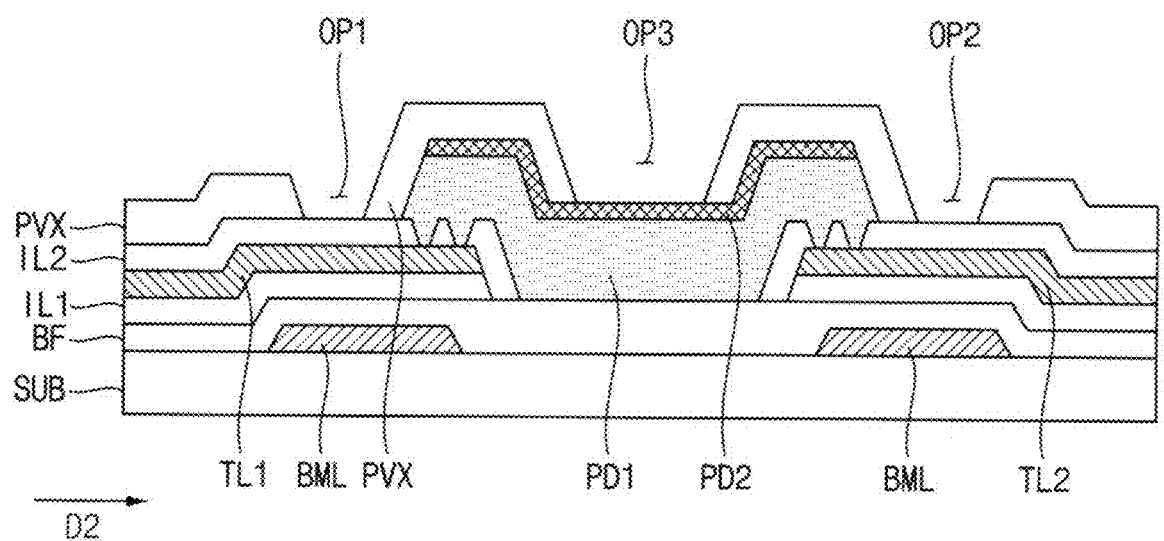

Referring to FIG. 8, FIG. 8 is cross-sectional view illustrating a cross section taken along line II-II' of FIG. 5, a cross section taken along line III-III' of FIG. 6, and a cross section taken along line IV-IV' of FIG. 7. Components illustrated in FIG. 8 may be substantially the same as components illustrated in FIG. 3 except for a shape of the conductive dummy pattern BML. The conductive dummy pattern BML may include a first portion overlapping the first opening OP1 and the first transmission line TL1 in a plan view, and a second portion spaced apart from the first portion and overlapping the second opening OP2 and the second transmission line TL2.

Figure 9:
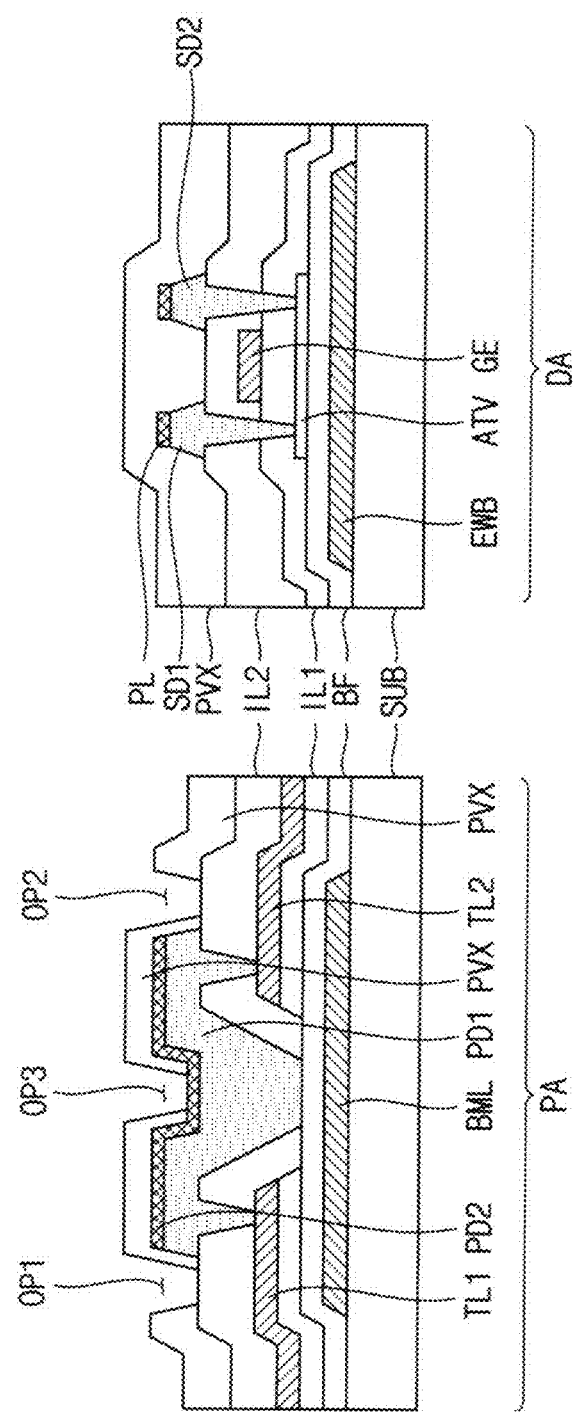
FIG. 9, FIG. 10, FIG. 11, and FIG. 12 are cross-sectional views illustrating a method of repairing a display device according to an embodiment of the present invention.
Figure 10:
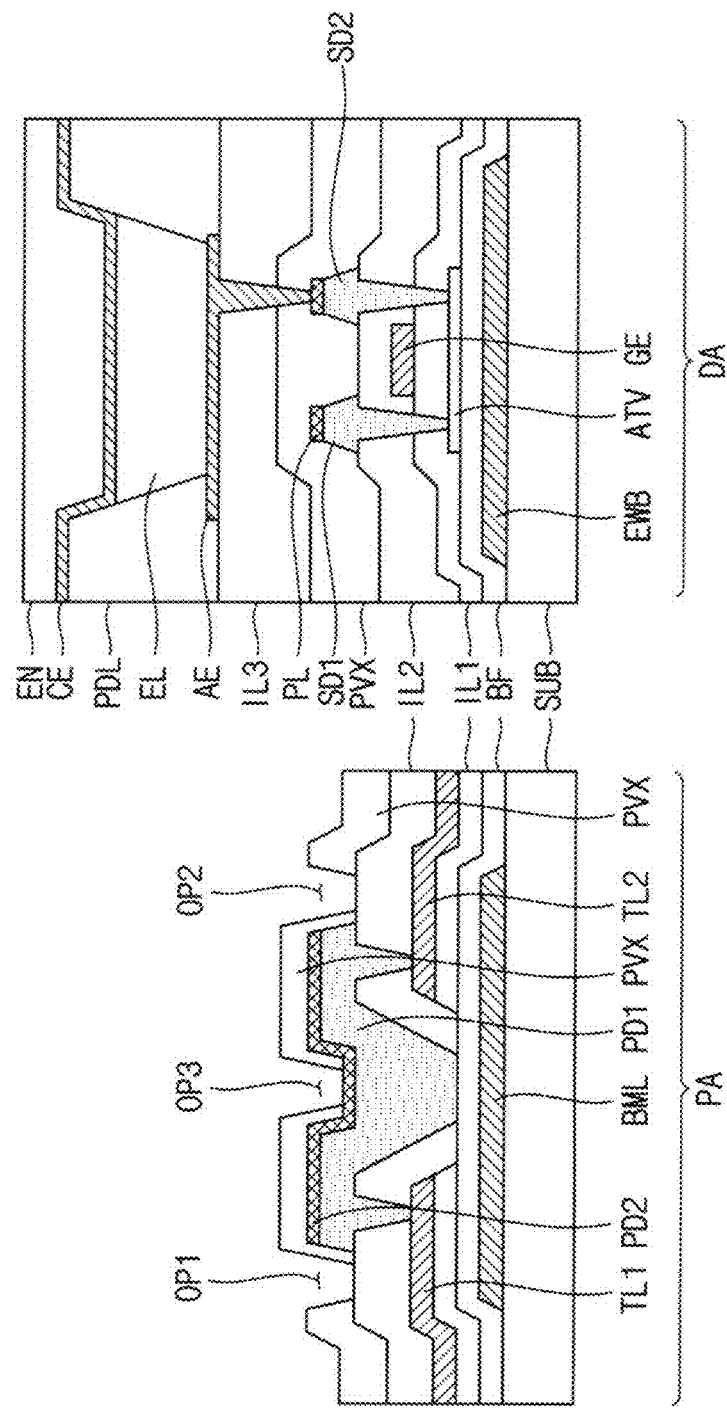
Figure 11:
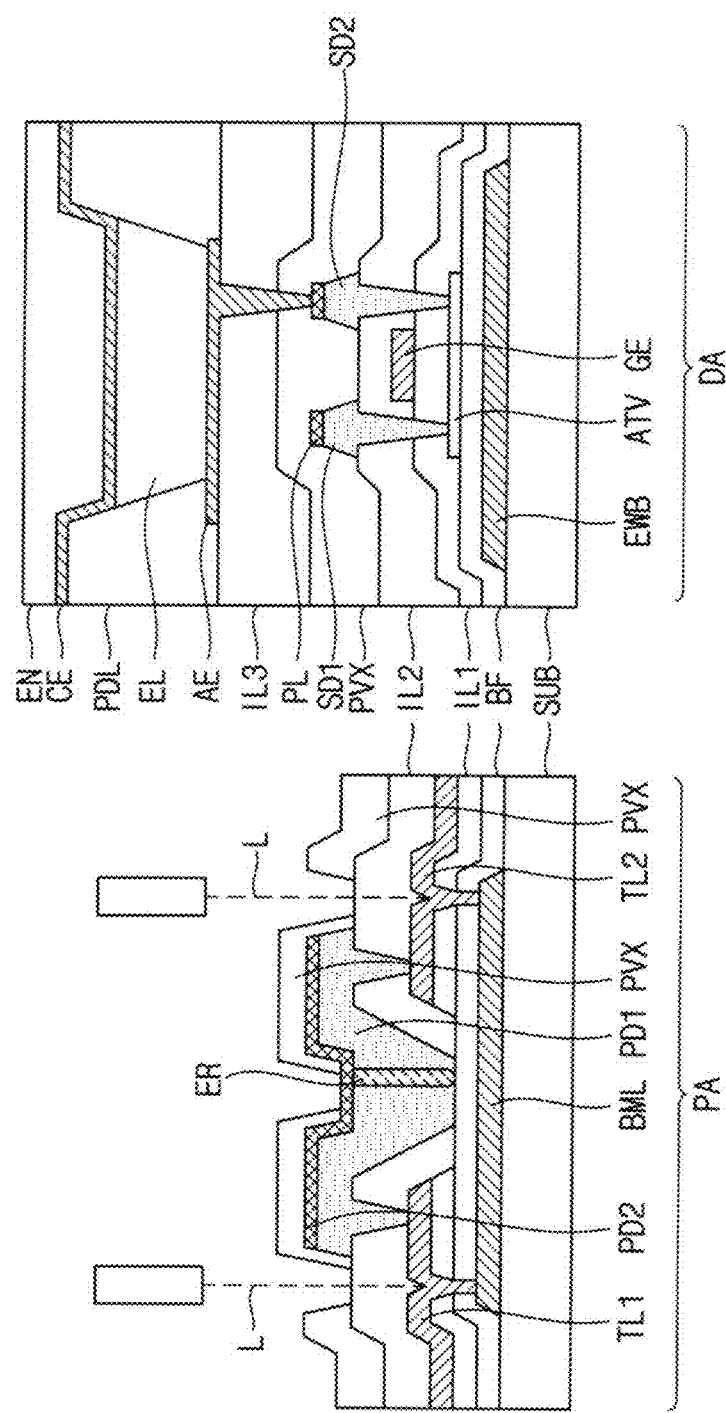

FIG. 9, FIG. 10, FIG. 11, and FIG. 12 are cross-sectional views illustrating a method of repairing a display device according to an embodiment of the present invention. FIG. 11 may be a diagram explaining a method of repairing a display device according to an embodiment.

Referring to FIG. 9, a substrate SUB, a conductive dummy pattern BML, a buffer layer BF, a first insulation layer IL1, a first transmission line TL1, a second transmission line TL2, a lower pad conductive layer PD1, an upper pad conductive layer PD2, and a passivation layer PVX may be disposed in the pad area PA. The passivation layer PVX may define a first opening OP1, a second opening OP2, and a third opening OP3 therein. Components disposed in the pad area PA described with reference to FIG. 9 may be substantially the same as the display device described with reference to FIGS. 2 and 3.

An antistatic layer EWB, the buffer layer BF, an active pattern ATV, the first insulation layer IL1, a gate electrode GE, source and drain electrodes SD1 and SD2, a protection electrode PL, the second insulation layer IL2, and the passivation layer PVX may be disposed in the display area DA. The active pattern ATV, the gate electrode GE, and the source and drain electrodes SD1 and SD2 may be defined as a transistor. The transistor may be electrically coupled with the second transmission line TL2.

The antistatic layer EWB may include the same material as a material included in the conductive dummy pattern BML. The antistatic layer EWB may prevent deterioration of light emission performance due to static electricity.

The buffer layer BF may cover the antistatic layer EWB. The buffer layer BF may reduce or block penetration of moisture, or impurities from the substrate SUB and the antistatic layer EWB. The buffer layer BF may include silicon oxide, silicon nitride, silicon oxynitride, or the like.

The active pattern ATV may be disposed on the buffer layer BF. The active pattern ATV may include a semiconductor material such as amorphous silicon, or polycrystalline silicon. For example, when the active pattern ATV includes polycrystalline silicon, at least portion of the active pattern ATV may be doped with an impurity such as n-type dopant or p-type dopant.

In one embodiment, the active pattern ATV may include an oxide semiconductor. For example, the active pattern ATV may include binary compound ($AB_x$), ternary compound ($AB_xC_y$), quaternary compound ($AB_xC_yD_z$) including indium, zinc, gallium, tin, titanium, aluminum, hafnium, zirconium, magnesium, and/or or the like.

The first insulation layer IL1 may be disposed on the active pattern ATV, and may cover the active pattern. The first insulation layer IL1 may insulate the active pattern ATV from the gate electrode GE. For example, the first insulation layer IL1 may include silicon oxide, silicon nitride, silicon oxynitride, insulating metal oxide, or a combination thereof, and may have a single layer structure or a multilayer structure. The insulating metal oxide may include aluminum oxide, tantalum oxide, hafnium oxide, zirconium oxide, titanium oxide, or the like.

The gate electrode GE may be disposed on the first insulation layer IL1. The gate electrode GE may include the same material as a material included in the first and second transmission wires TL1 and TL2. For example, the gate electrode GE may include gold, silver, aluminum, copper, nickel, platinum, magnesium, chromium, tungsten, molybdenum, titanium, tantalum, or an alloy thereof, and may have a single layer or a multilayer structure including different metal layers. In one embodiment, the gate electrode GE may include at least copper. For example, the gate electrode GE may have a single layer including a copper layer or a multilayer structure including a copper layer and a titanium layer covering the copper layer.

The second insulation layer IL2 may be disposed on the gate electrode GE, and may cover the gate electrode GE. The second insulation layer IL2 may insulate the gate electrode GE from the source and drain electrodes SD1 and SD2. For example, the second insulation layer IL2 may include silicon oxide, silicon nitride, silicon oxynitride, insulating metal oxide, or a combination thereof, and may have a single layer structure or a multilayer structure. The insulating metal oxide may include aluminum oxide, tantalum oxide, hafnium oxide, zirconium oxide, titanium oxide, or the like.

The source and drain electrodes SD1 and SD2 may be disposed on the second insulation layer IL2. The source and drain electrodes SD1 and SD2 may include same material as a material included in the lower pad conductive layer PD1. For example, the source and drain electrodes SD1 and SD2 may include copper. The source and drain electrodes SD1 and SD2 may directly contact the active pattern ATV through a through hole defined in the first and second insulation layers IL1 and IL2.

The protection electrode PL may be disposed on the source and drain electrodes SD1 and SD2. The protection electrode PL may cover an upper surface of the source and drain electrodes SD1 and SD2. The protection electrode PL may include the same material as a material included in the upper pad conductive layer PD2. For example, the protection electrode PL may include indium tin oxide, indium zinc oxide, zinc tin oxide, indium oxide, zinc oxide, or tin oxide.

The passivation layer PVX may be disposed on the source and drain electrode SD1 and SD2. The passivation layer PVX may cover the source and drain electrode SD1 and SD2 and the protection electrode PL.

Referring to FIG. 10, in the display area DA, a third insulation layer IL3 may be disposed on the passivation layer PVX. The third insulation layer IL3 may include organic insulating material. An upper surface of the third insulation layer IL3 may be flat surface.

An anode electrode AE may be disposed on the third insulation layer IL3. The anode electrode AE may be electrically coupled with one of the source and drain electrodes SD1 and SD2. For example, the anode electrode AE may be electrically coupled with one of the source and drain electrodes SD1 and SD2 through a through hole formed in the third insulation layer IL3 and the passivation layer PVX.

A pixel defining layer PDL may be disposed on the third insulation layer IL3 to define a pixel area by exposing at least a portion of the anode electrode AE. For example, the pixel defining layer PDL may include polyacrylate resin, polyimide resin, or the like.

An emission layer EL may be disposed on the anode electrode AE in the pixel area, and a cathode electrode CE may be disposed on the pixel defining layer PDL and the emission layer EL. The anode electrode AE may be electrically coupled with the transistor defined by the active pattern ATV, gate electrode GE and the source and drain electrodes SD1 and SD2. Accordingly, the driving signal supplied from the transistor may be transmitted to the emission layer EL through the anode electrode AE. The emission layer may emit a light having a luminance corresponding to the intensity of the driving signal.

The emission layer EL may include a low molecular weight organic material or a high molecular weight organic material. At least one of a hole injection layer ("HIL") and a hole transport layer ("HTL") may be further disposed between the anode electrode AE and the emission layer EL, and at least one of an electron transport layer ("ETL") and an electron injection layer ("EIL") may be further disposed between the emission layer EL and the cathode electrode CE.

Each of the anode electrode AE and the cathode electrode CE may include one of a transparent electrode, a transflective electrode, and a reflective electrode.

To form the transparent electrode, a transparent conductive oxide ("TCO") may be used. The transparent conductive oxide (TCO) may include indium tin oxide ("ITO"), indium zinc oxide ("IZO"), zinc oxide (ZnO), indium oxide ($In_2O_3$), or the like.

To form the transflective electrode and reflective electrode, magnesium, silver, gold, calcium, lithium, chromium, aluminum, copper or alloys thereof may be used. In this case, the transflective electrode and the reflective electrode may be determined by thickness. In general, the transflective electrode may have a thickness of about 200 nanometers (nm) or less, and the reflective electrode may have a thickness of about 300 nm or more.

An encapsulation layer EN may be disposed on the cathode electrode. The encapsulation layer EN may include one or more inorganic layers and one or more organic layers. The inorganic layer and the organic layer included in the encapsulation layer EN may have a structure in which the inorganic layer and the organic layer are alternately stacked. In this case, the inorganic layer may directly contact the upper surface of the cathode electrode CE. For example, the inorganic layer may include one or more inorganic materials such as $Al_2O_3$, $TiO_2$, ZrO, $SiO_2$, AlON, AlN, SiON, $SI_3N_4$, ZnO, and $Ta_2O_5$. The inorganic layer may block penetration of moisture or oxygen. The organic layer may be formed of a polymer-based material. For example, the polymer-based material may include acrylic resin, epoxy resin, polyimide, polyethylene, or the like.

Referring to FIG. 11, in the pad area PA, a defect ER may occur in the lower pad conductive layer PD1. A conductivity of the lower pad conductive layer PD1 may be relatively lowered due to the defect ER. Accordingly, the driving signal or the power signal supplied from a driving element (for example, a driving element MD of FIG. 12) may not be transmitted normally to the second transmission line TL2 through the lower pad conductive layer PD1. So, in the display area DA, the emission layer EL may not emit light.

To repair the defect ER, a method of repairing a display device including a step of electrically connecting the conductive dummy pattern BML and the first and second transmission lines TL1 and TL2 by irradiating the first and second openings OP1 and OP2 with a laser L. Specifically, in the pad area PA, each of the first opening OP1 and the second opening OP2 may be irradiated with the laser L. Accordingly, the first transmission line TL1 may be electrically coupled with the conductive dummy pattern BML in an area overlapping the first opening OP1. And, the second transmission line TL2 may be electrically coupled with the conductive dummy pattern BML in an area overlapping the second opening OP2. Accordingly, the driving signal supplied from the driving element may be transmitted to the second transmission line TL2 through the first transmission line TL1 and the conductive dummy pattern BML.

In one embodiment, the method of repairing the display device may further include inputting a test signal to the first transmission line TL1 and checking an output of the test signal. For example, checking the output may include checking an emission of light from array of pixel PX. More specifically, after inputting the test signal to the first transmission line TL1, by checking whether the emission layer EL emits light, the defect ER existing in the lower pad conductive layer PD1 may be identified.

In this case, when the output of the test signal is not identified (for example, when the emission layer EL does not emits light), the first and second opening OP1 and OP2 may be irradiated with the laser L.

Figure 12:
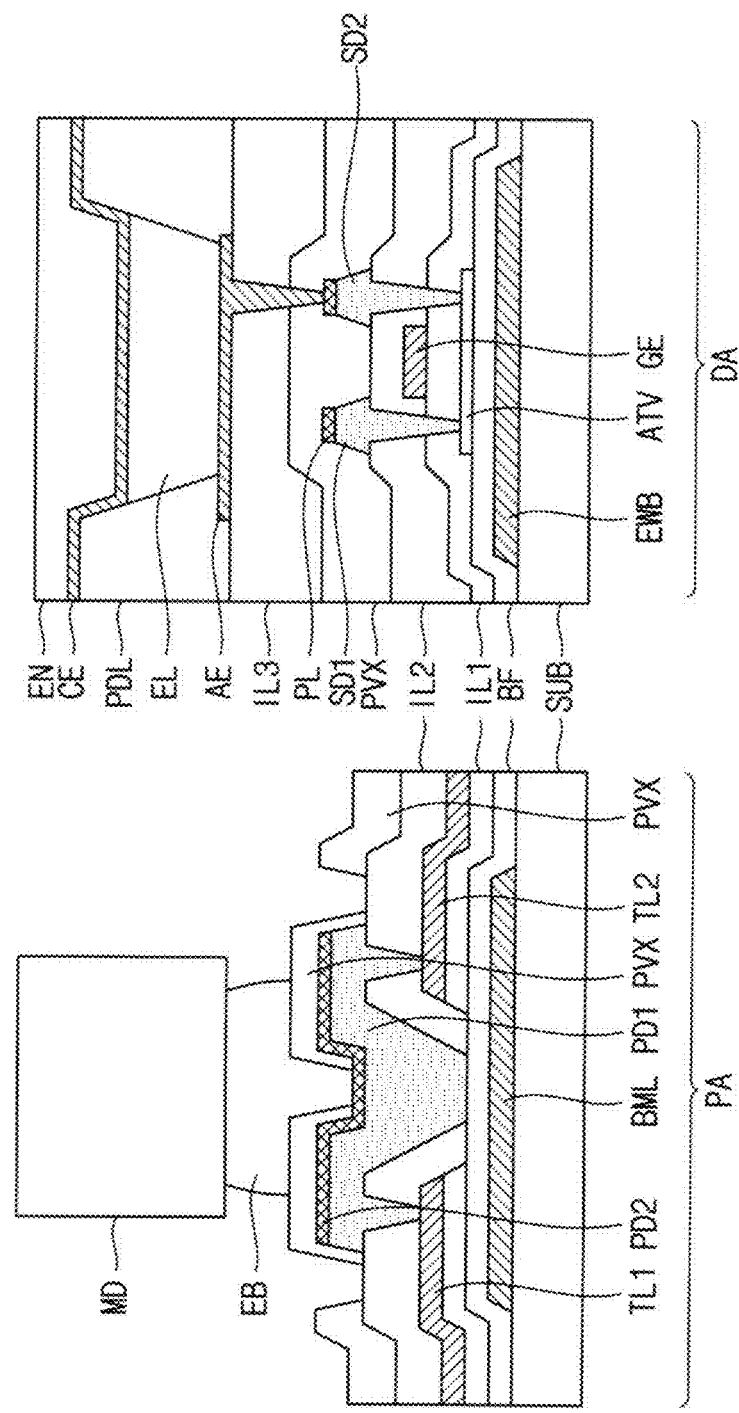

Referring to FIG. 12, a conductive bonding element EB may be disposed on the passivation layer PVX. The conductive bonding element EB may be electrically coupled with the upper pad conductive layer PD2 through the third opening OP3. Accordingly, the upper pad conductive layer PD2 may be electrically coupled with a driving element MD through the conductive bonding element EB. For example. The conductive bonding element EB may include metal bump, anisotropic conductive film.

The driving element MD may be disposed on the conductive bonding element EB. The driving element MD may include flexible circuit film on which a driving chip is mounted, a printed circuit board, or the like. The driving element MD may provide the driving signal or the power signal.

The driving signal or the power signal supplied from the driving element MD may be transmitted to the emission layer EL in the display area DA through the conductive bonding element EB, the upper pad conductive layer PD2, the lower pad conductive layer PD1, and the second transmission line TL2.

In this case, when the defect ER occurs in the lower pad conductive layer PD2, the display device may be repaired by performing the method of repairing the display device described above with reference to FIG. 11. Accordingly, the driving signal or the power signal supplied from the driving element MD may be transmitted to the emission layer EL in the display area DA through the conductive bonding member EB, the upper pad conductive layer PD2, the lower pad conductive layer PD1, the first transmission line TL1, the conductive dummy pattern BML, and the second transmission line TL2.

The present invention may be applied to various display devices. For example, the present invention may be applicable to numerous display devices such as display devices for vehicles, ships and aircraft, portable communication devices, display devices for exhibition or information transmission, medical display devices, or the like. It should be understood that embodiments described herein should be considered in a descriptive sense only not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
  an array of pixels disposed on a display area;
  a connection pad disposed on a pad area;
  a transmission line electrically coupled with the connection pad, and which transmits a driving signal or a power signal to the array of pixels; and
  a conductive dummy pattern disposed under the transmission line, wherein a part of the conductive dummy pattern overlaps the transmission line in a plan view,
  wherein the connection pad comprises:
    a pad conductive layer electrically coupled with the transmission line; and
    a passivation layer disposed on the pad conductive layer,
  wherein the passivation layer covers at least a side surface of the pad conductive layer and defines an opening overlapping the conductive dummy pattern and the transmission line in the plan view.

2. The display device of claim 1, wherein the transmission line comprises a first transmission line, and a second transmission line spaced apart from the first transmission line.

3. The display device of claim 2, wherein the conductive dummy pattern overlaps the first transmission line in a first area, and overlaps the second transmission line in a second area in the plan view.

4. The display device of claim 3, wherein the passivation layer defines:
  a first opening spaced apart from the pad conductive layer, and which overlaps the conductive dummy pattern and the first transmission line in the plan view; and
  a second opening spaced apart from the pad conductive layer, and which overlaps the conductive dummy pattern and the second transmission line in the plan view.

5. The display device of claim 4, wherein the first transmission line is electrically coupled with the conductive dummy pattern in an area overlapping the first opening in the plan view, and the second transmission line is electrically coupled with the conductive dummy pattern in an area overlapping the second opening in the plan view.

6. The display device of claim 1, further comprising:
  a buffer layer disposed between the conductive dummy pattern and the transmission line, wherein the buffer layer covers the conductive dummy pattern.

7. The display device of claim 1, wherein the pad conductive layer comprises a lower pad conductive layer electrically coupled with the transmission line, and an upper pad conductive layer disposed on the lower pad conductive layer,
  wherein the upper pad conductive layer covers an upper surface of the lower pad conductive layer.

8. The display device of claim 7, wherein the lower pad conductive layer includes copper.

9. The display device of claim 7, wherein the upper pad conductive layer includes indium zinc oxide, zinc tin oxide, indium oxide, zinc oxide, or tin oxide.

10. The display device of claim 1, further comprising:
  a first insulation layer disposed under the transmission line.

11. The display device of claim 1, further comprising:
  a second insulation layer disposed on the transmission line.

12. The display device of claim 1, wherein the transmission line is provided in plural, wherein the conductive dummy pattern overlaps the plurality of transmission lines.

13. The display device of claim 12, wherein the conductive dummy pattern has a 'U' shape.

14. The display device of claim 12, wherein the conductive dummy pattern has an 'H' shape.

15. The display device of claim 1, wherein the conductive dummy pattern overlaps the transmission line configured as a single transmission line.

* * * * *